United States Patent
Lu et al.

(10) Patent No.: US 7,058,909 B2
(45) Date of Patent: Jun. 6, 2006

(54) METHOD OF GENERATING AN EFFICIENT STUCK-AT FAULT AND TRANSITION DELAY FAULT TRUNCATED SCAN TEST PATTERN FOR AN INTEGRATED CIRCUIT DESIGN

(75) Inventors: Cam L. Lu, Milpitas, CA (US); Robert B. Benware, Ft. Collins, CO (US); Thai M. Nguyen, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 194 days.

(21) Appl. No.: 10/728,036

(22) Filed: Dec. 3, 2003

(65) Prior Publication Data
US 2005/0125755 A1    Jun. 9, 2005

(51) Int. Cl.
*G06F 17/50* (2006.01)

(52) U.S. Cl. .............................. 716/4; 716/5; 714/703; 714/726; 714/735; 714/736; 714/815; 714/47

(58) Field of Classification Search .................... 716/4; 714/42
See application file for complete search history.

(56) References Cited
U.S. PATENT DOCUMENTS
2005/0066242 A1 * 3/2005 Wang et al. ................. 714/700

OTHER PUBLICATIONS

Lin et al., "High-Frequency, At-Speed Scan Testing," IEEE, Oct. 2003, pp. 17-25.*
Wang et al., "DS0LFSR: A BIST TPG for Low Switching Activity," IEEE, Jul. 2002, pp. 842-851.*
Heragu et al., "FACTS: Fault Coverage Estimation by Test Vector Sampling," IEEE, 1994, pp. 266-271.*
Benware, B.R.; Effectiveness Comparisons of Outlier Screening Methods for Frequency Dependent Defects on Complex ASICs; LSI Logic Corporation and IC Design & Test Lab, Portland State University. Apr. 27-May 1, 2003, pp. 1-8.

* cited by examiner

*Primary Examiner*—Vuthe Siek
(74) *Attorney, Agent, or Firm*—Fitch, Even, Tabin & Flannery

(57) ABSTRACT

A method of generating a truncated scan test pattern for an integrated circuit design includes steps of: (a) receiving as input an integrated circuit design; (b) estimating a number of transition delay fault test patterns and a corresponding number of top-off stuck-at fault patterns to achieve maximum stuck-at fault and transition delay fault coverage; (c) truncating the estimated number of transition delay fault patterns to generate a truncated set of transition delay fault patterns so that the truncated set of transition delay fault patterns and the corresponding number of top-off stuck-at fault patterns achieve maximum stuck-at fault and transition delay fault coverage within a selected scan memory limit; and (d) generating as output the truncated set of transition delay fault patterns and the corresponding number of top-off stuck-at fault patterns.

16 Claims, 8 Drawing Sheets

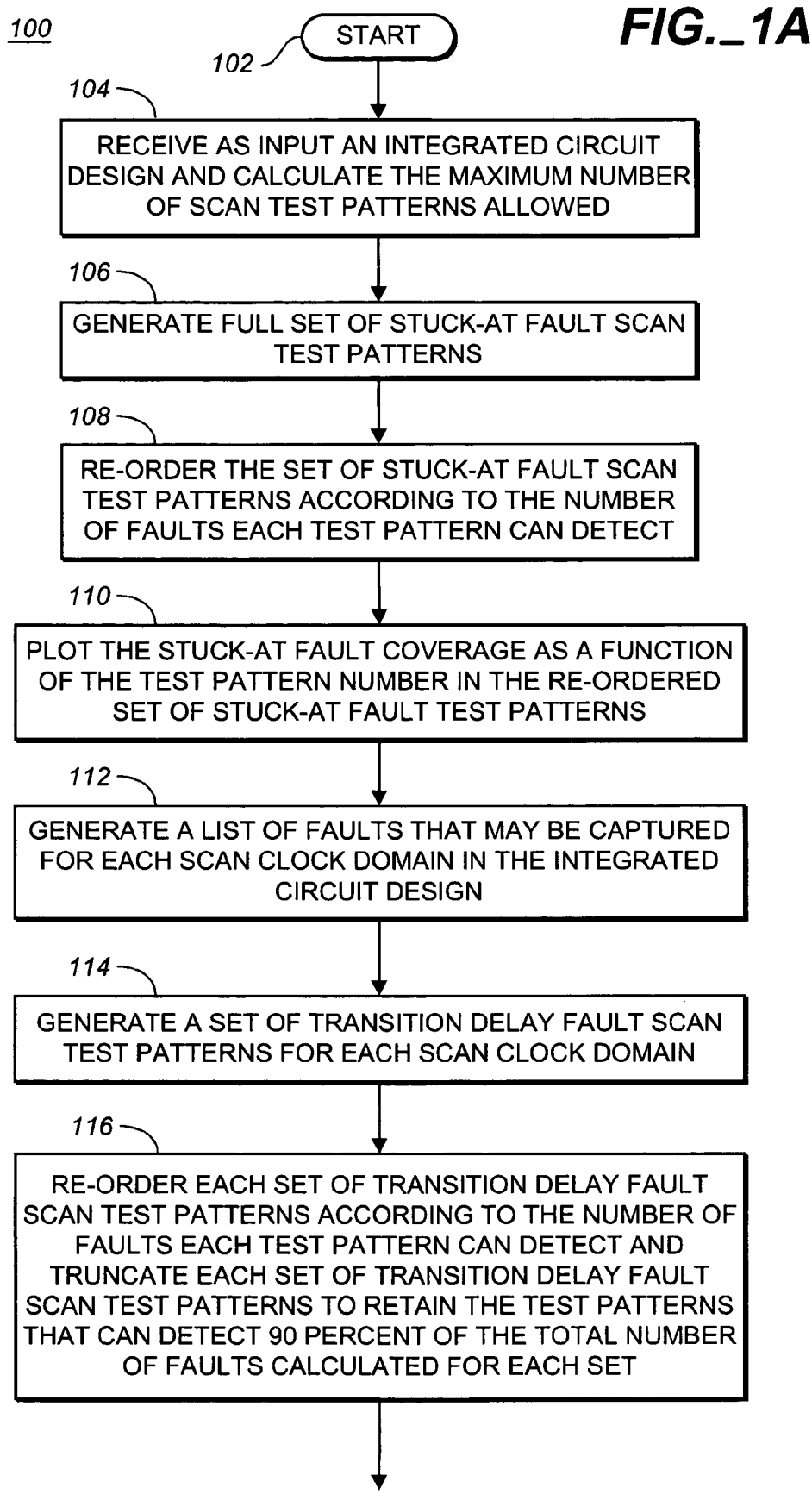
FIG._1A

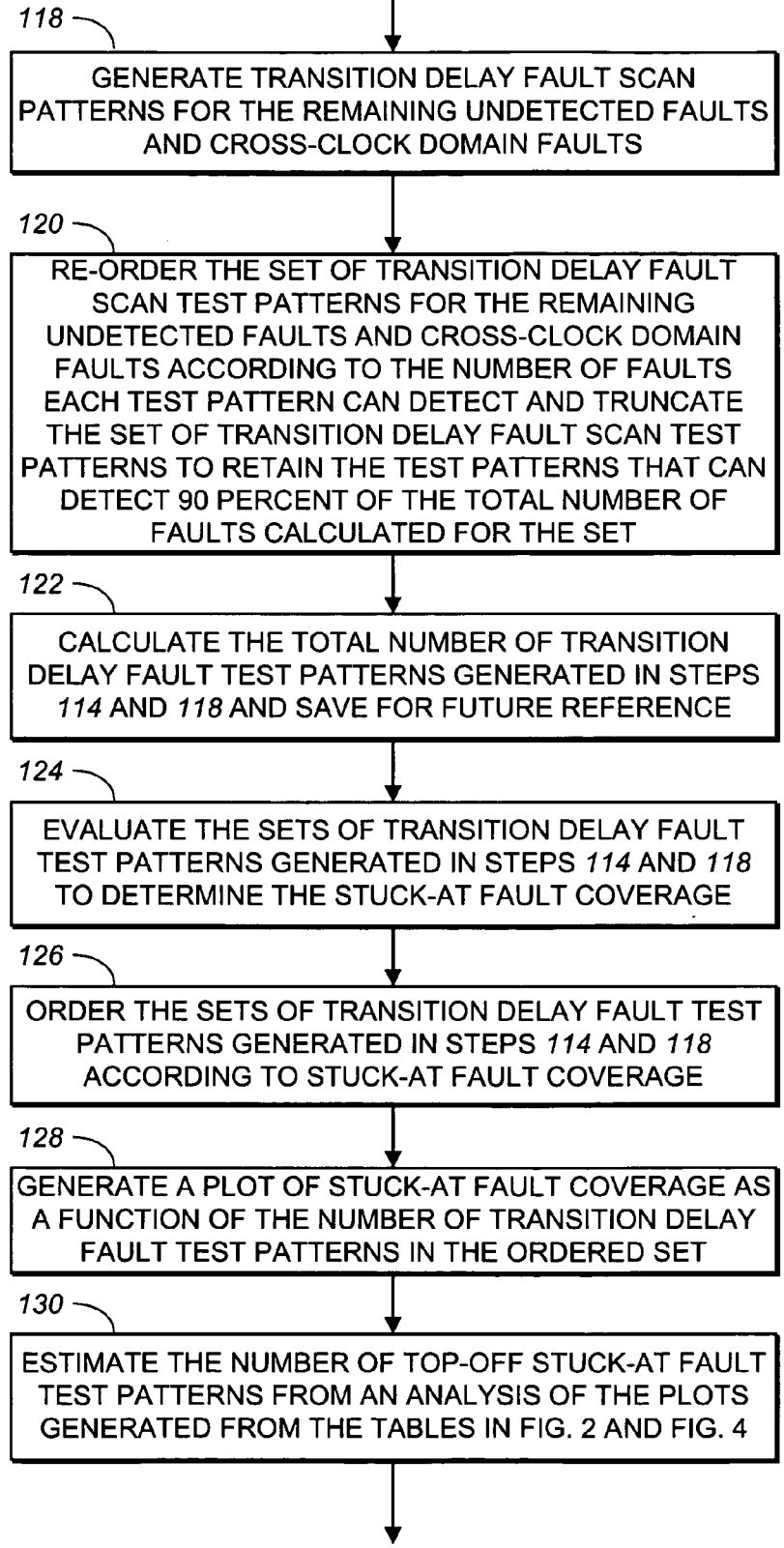
FIG._1B

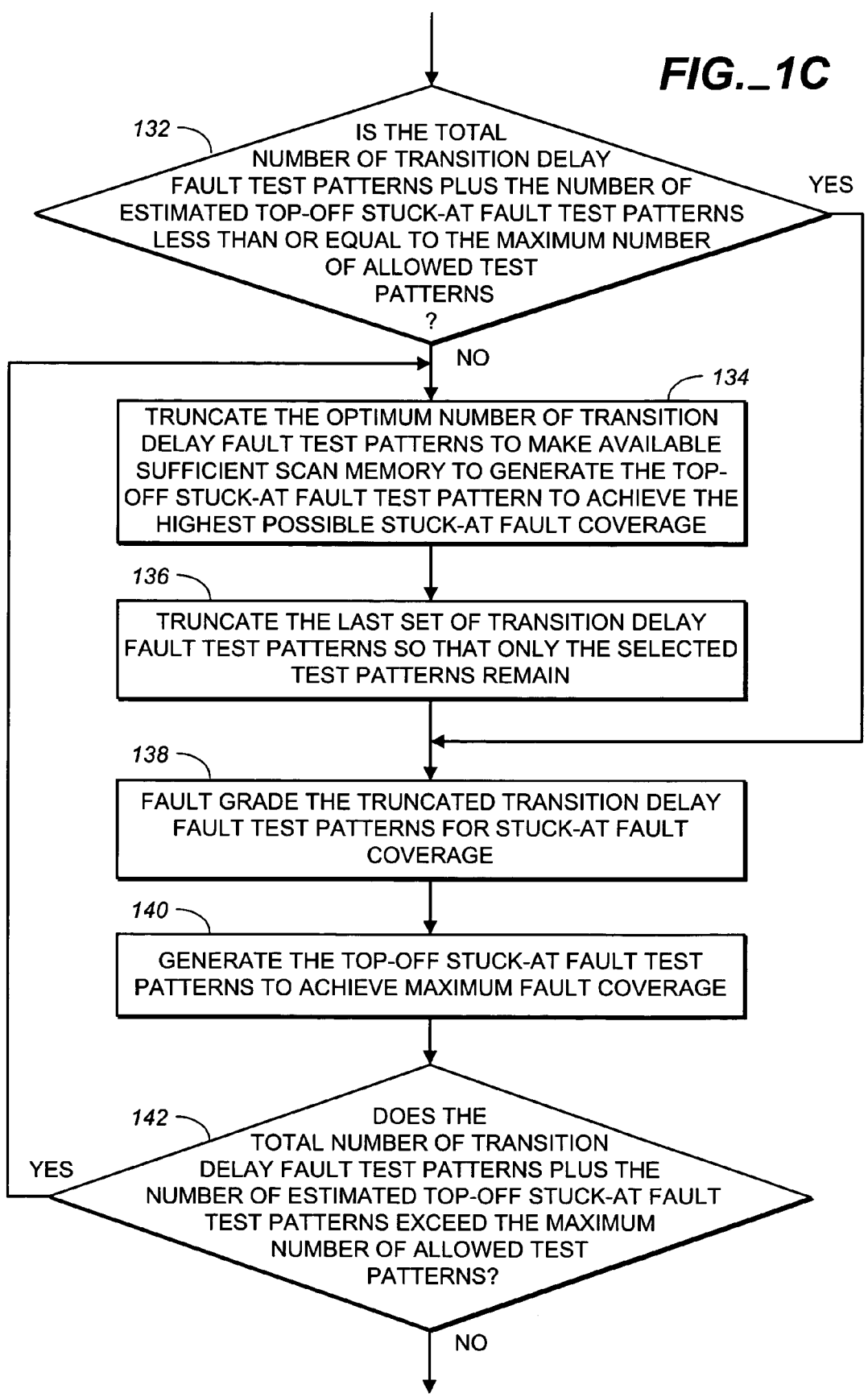

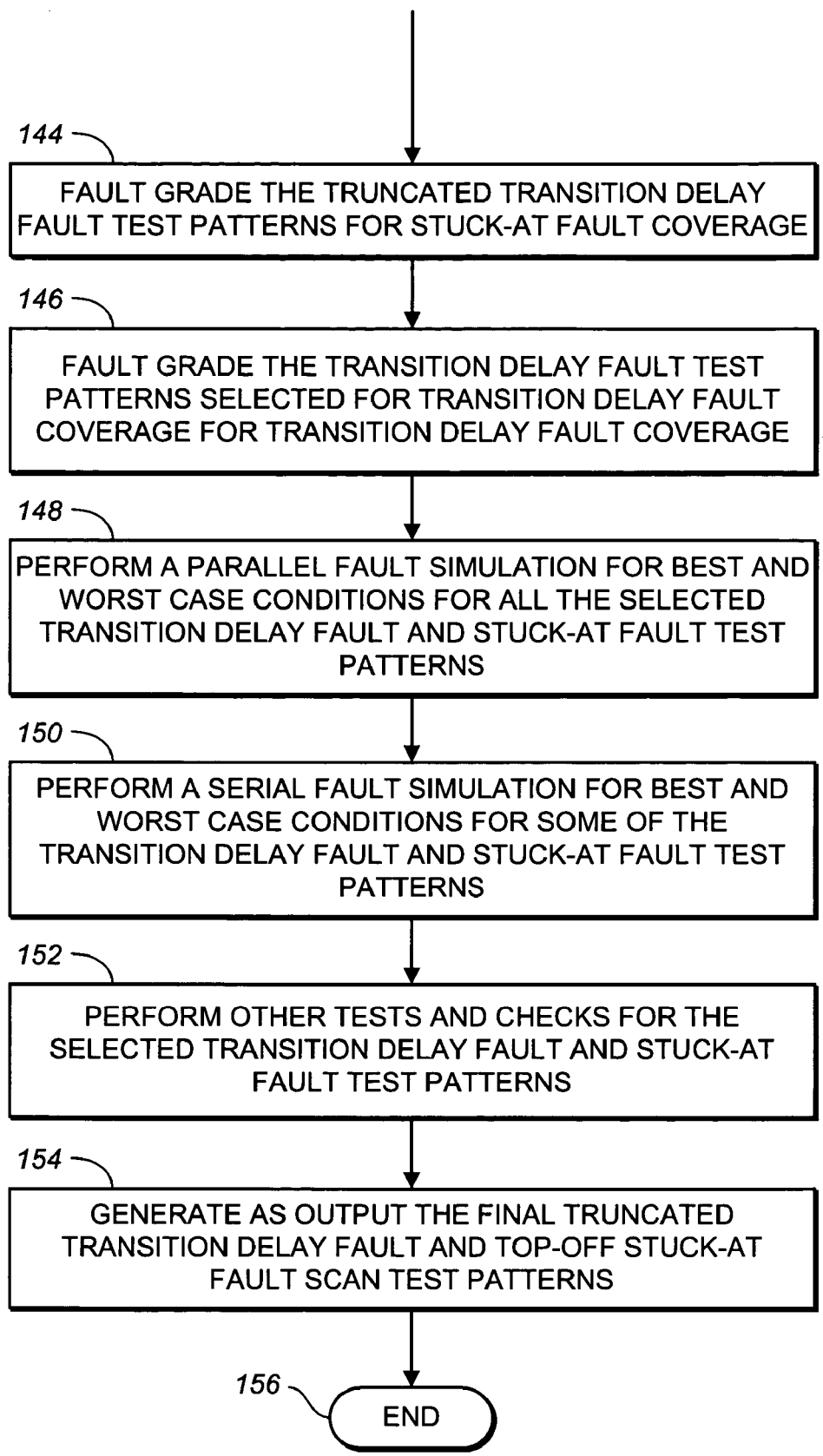
FIG._1D

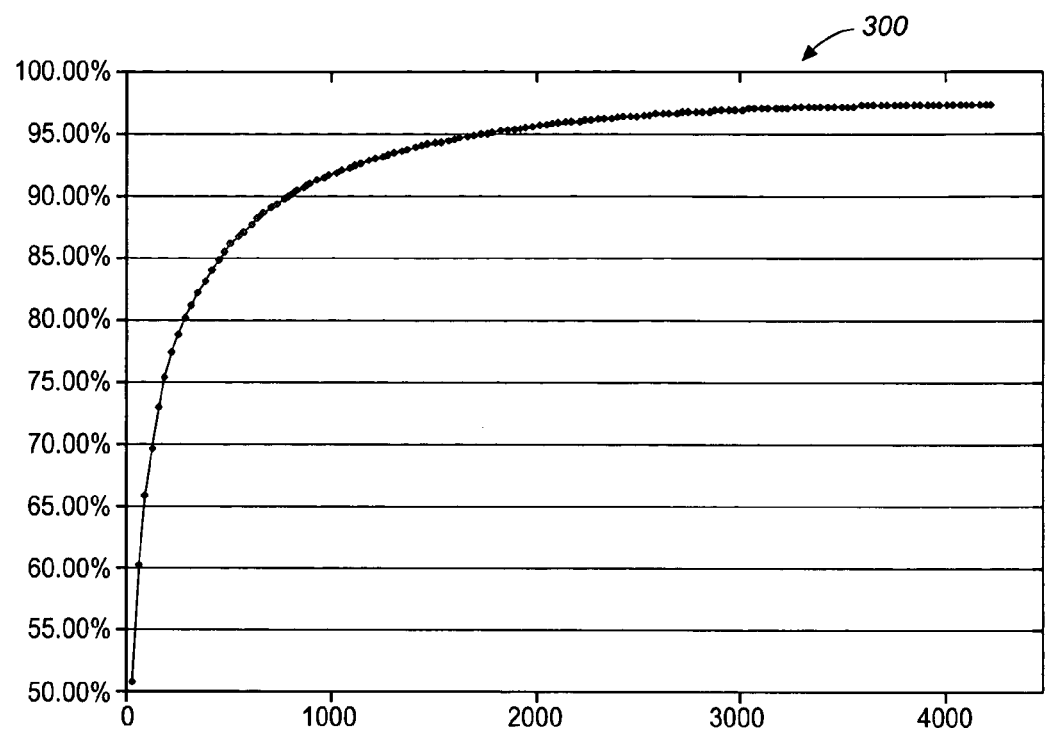
FIG._3
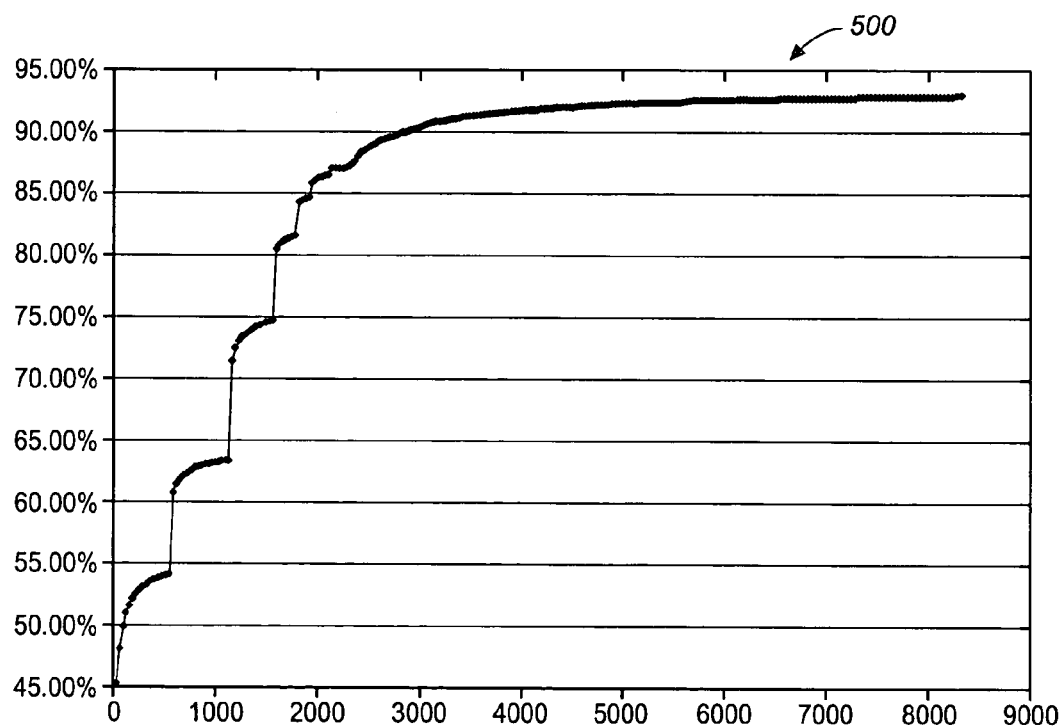
FIG._5

| | | | | | | | | | |
|---|---|---|---|---|---|---|---|---|---|
| 1408 | 74.26% | 5592 | 3458 | 91.08% | 3542 | 5570 | 92.26% | 1430 | 7682 | 92.66% | -682 |
| 1440 | 74.35% | 5560 | 3490 | 91.13% | 3510 | 5602 | 92.27% | 1398 | 7714 | 92.66% | -714 |
| 1472 | 74.45% | 5528 | 3522 | 91.17% | 3478 | 5634 | 92.28% | 1366 | 7746 | 92.67% | -746 |
| 1504 | 74.53% | 5496 | 3554 | 91.20% | 3446 | 5666 | 92.29% | 1334 | 7778 | 92.67% | -778 |
| 1536 | 74.60% | 5464 | 3586 | 91.23% | 3414 | 5698 | 92.29% | 1302 | 7810 | 92.67% | -810 |
| 1568 | 80.41% | 5432 | 3618 | 91.26% | 3382 | 5730 | 92.30% | 1270 | 7842 | 92.68% | -842 |
| 1600 | 80.89% | 5400 | 3650 | 91.29% | 3350 | 5762 | 92.31% | 1238 | 7874 | 92.68% | -874 |
| 1632 | 81.13% | 5368 | 3682 | 91.33% | 3318 | 5794 | 92.31% | 1206 | 7906 | 92.68% | -906 |
| 1664 | 81.28% | 5336 | 3714 | 91.35% | 3286 | 5826 | 92.32% | 1174 | 7938 | 92.69% | -938 |
| 1696 | 81.39% | 5304 | 3746 | 91.38% | 3254 | 5858 | 92.32% | 1142 | 7970 | 92.69% | -970 |
| 1728 | 81.48% | 5272 | 3778 | 91.42% | 3222 | 5890 | 92.33% | 1110 | 8002 | 92.69% | -1002 |
| 1760 | 81.55% | 5240 | 3810 | 91.44% | 3190 | 5922 | 92.34% | 1078 | 8034 | 92.70% | -1034 |
| 1792 | 84.11% | 5208 | 3842 | 91.46% | 3158 | 5954 | 92.34% | 1046 | 8066 | 92.70% | -1066 |
| 1824 | 84.37% | 5176 | 3874 | 91.49% | 3126 | 5986 | 92.34% | 1014 | 8098 | 92.70% | -1098 |
| 1856 | 84.51% | 5144 | 3906 | 91.51% | 3094 | 6018 | 92.35% | 982 | 8130 | 92.71% | -1130 |
| 1888 | 84.59% | 5112 | 3938 | 91.54% | 3062 | 6050 | 92.35% | 950 | 8162 | 92.71% | -1162 |
| 1920 | 85.79% | 5080 | 3970 | 91.56% | 3030 | 6082 | 92.36% | 918 | 8194 | 92.72% | -1194 |
| 1952 | 86.07% | 5048 | 4002 | 91.58% | 2998 | 6114 | 92.41% | 886 | 8226 | 92.72% | -1226 |
| 1984 | 86.22% | 5016 | 4034 | 91.61% | 2966 | 6146 | 92.42% | 854 | 8258 | 92.73% | -1258 |
| 2016 | 86.31% | 4984 | 4066 | 91.62% | 2934 | 6178 | 92.43% | 822 | 8290 | 92.73% | -1290 |
| 2048 | 86.38% | 4952 | 4098 | 91.64% | 2902 | 6210 | 92.44% | 790 | | | |
| 2080 | 86.43% | 4920 | 4130 | 91.66% | 2870 | 6242 | 92.44% | 758 | | | |
| 2112 | 86.93% | 4888 | 4162 | 91.68% | 2838 | 6274 | 92.45% | 726 | | | |

FIG._4B

METHOD OF GENERATING AN EFFICIENT STUCK-AT FAULT AND TRANSITION DELAY FAULT TRUNCATED SCAN TEST PATTERN FOR AN INTEGRATED CIRCUIT DESIGN

BACKGROUND OF THE INVENTION

1. Field of the Invention

The present invention is directed to testing and screening of integrated circuit dies to detect defective devices. More specifically, but without limitation thereto, the present invention is directed to a method of screening defective dies to achieve maximum stuck-at fault and transition delay fault test coverage for an integrated circuit design.

2. Description of Related Art

Scan based methods for stuck-at fault (SAF) and transition delay fault (TDF) testing of integrated circuit dies generally requires a large number of test patterns to achieve satisfactory test coverage, in some cases, more than 30,000 patterns. Previous methods to reduce the pattern count include inserting logic into the integrated circuit design to perform data compaction, however, this method requires extra resources and added cost. Another method is launch-off shift TDF pattern generation, in which the test pattern transitions are launched during shift. The launch-off shift method has been proven to reduce the number of TDF patterns with higher fault coverage, however, the launch-off shift method requires routing the global scan enable as a clock having a well-controlled insertion delay relationship with all other clocks in the integrated circuit design, which may not be practical in some integrated circuit designs.

SUMMARY OF THE INVENTION

In one aspect of the present invention, a method of generating a truncated scan test pattern for an integrated circuit design includes steps of:
- (a) receiving as input an integrated circuit design;
- (b) estimating a number of transition delay fault test patterns and a corresponding number of top-off stuck-at fault patterns to achieve maximum stuck-at fault and transition delay fault coverage;
- (c) truncating the estimated number of transition delay fault patterns to generate a truncated set of transition delay fault patterns so that the truncated set of transition delay fault patterns and the corresponding number of top-off stuck-at fault patterns achieve maximum stuck-at fault and transition delay fault coverage within a selected scan memory limit; and
- (d) generating as output the truncated set of transition delay fault patterns and the corresponding number of top-off stuck-at fault patterns.

In another aspect of the present invention, a computer program product for generating a truncated scan test pattern for an integrated circuit design includes:
- a medium for embodying a computer program for input to a computer; and
- a computer program embodied in the medium for causing the computer to perform steps of:
  - (a) receiving as input an integrated circuit design;
  - (b) estimating a number of transition delay fault test patterns and a corresponding number of top-off stuck-at fault patterns to achieve maximum stuck-at fault and transition delay fault coverage;
  - (c) truncating the estimated number of transition delay fault patterns to generate a truncated set of transition delay fault patterns so that the truncated set of transition delay fault patterns and the corresponding number of top-off stuck-at fault patterns achieve maximum stuck-at fault and transition delay fault coverage within a selected scan memory limit; and
  - (d) generating as output the truncated set of transition delay fault patterns and the corresponding number of top-off stuck-at fault patterns.

BRIEF DESCRIPTION OF THE DRAWINGS

The present invention is illustrated by way of example and not limitation in the accompanying figures, in which like references indicate similar elements throughout the several views of the drawings, and in which:

FIGS. 1A, 1B, 1C and 1D illustrate a flow chart of a method of truncating transition delay fault test patterns according to an embodiment of the present invention;

FIG. 2 illustrates a table of values used to generate the plot of FIG. 3;

FIG. 3 illustrates a plot of stuck-at fault coverage as a function of the stuck-at fault test pattern number according to an embodiment of the present invention;

FIGS. 4A and 4B illustrate a table of values used to generate the plot of FIG. 5; and FIG. 5 illustrates a plot of stuck-at fault coverage as a function of the test pattern number for the transition delay fault test patterns according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Frequency dependent defects in integrated circuit die that result in severe timing failures are typically referred to as transition delay faults (TDF). Historically, transition delay faults have been screened using at-speed or high-speed functional testing of the die. Due to the cycle time required during the design phase, however, it is desirable to generate a screening method for transition delay faults using scan chains. The number of possible test patterns that may be used for both stuck-at fault (SAF) and transition delay fault (TDF) test patterns is determined by the size of the scan memory available in standard production testing equipment.

Transition delay fault test patterns also detect stuck-at faults. Accordingly, transition delay fault patterns are preferably generated first to detect both stuck-at faults and transition delay faults. The transition delay fault patterns may then be analyzed to determine the stuck-at fault coverage, and the remaining, or top-off, stuck-at fault patterns may be generated to achieve maximum fault coverage for both stuck-at faults and transition delay faults. Unfortunately, however, the total number of fault patterns generated may exceed the scan memory limit of the testing equipment.

In a method of the present invention, the number of transition delay fault test patterns is truncated to leave enough scan memory for the top-off stuck-at fault pattern, while still achieving maximum fault coverage.

In one aspect of the present invention, a method of generating a truncated scan test pattern for an integrated circuit design includes steps of:

(a) receiving as input an integrated circuit design;
(b) estimating a number of transition delay fault test patterns and a corresponding number of top-off stuck-at fault patterns to achieve maximum stuck-at fault and transition delay fault coverage;
(c) truncating the estimated number of transition delay fault patterns to generate a truncated set of transition delay fault patterns so that the truncated set of transition delay fault patterns and the corresponding number of top-off stuck-at fault patterns achieve maximum stuck-at fault and transition delay fault coverage within a selected scan memory limit; and
(d) generating as output the truncated set of transition delay fault patterns and the corresponding number of top-off stuck-at fault patterns.

The steps of estimating a number of transition delay fault test patterns and a corresponding number of top-off stuck-at fault patterns and truncating the estimated number of transition delay fault test patterns are further detailed in the flow chart of FIG. 1.

FIGS. 1A, 1B, 1C and 1D illustrate a flow chart 100 of a method of truncating transition delay fault test patterns according to an embodiment of the present invention.

Step 102 is the entry point of the flow chart 100.

In step 104, an integrated circuit design is received as input, and the maximum number of scan test patterns for the integrated circuit design that may be accommodated by the current scan test equipment is calculated from the available scan memory. A portion of the available scan memory is preferably reserved for scan quiescent current (IDDQ) and memory built-in self repair (BISR) scan tests.

A scan pattern requires both scan memory and functional (parallel) memory in the integrated circuit design to store each scan pattern. The same amount of scan memory is required for either a stuck-at fault scan pattern or a transition delay fault scan pattern, however, an additional functional (parallel) memory location is required to store each transition delay fault scan pattern. Fortunately, the size of the functional (parallel) memory is generally not a severe limitation in scan testing.

In step 106, a full set of stuck-at scan test patterns is generated according to well known techniques, for example, by commercially available scan test pattern generation software. A full set of stuck-at scan test patterns is a set that can detect the maximum number of faults that may be detected in the integrated circuit design. Preferably, the scan test patterns are checked and debugged, if necessary, to ensure that they pass best/worst case conditions for parallel and serial simulations. The number of faults that may be detected by each of the stuck-at fault scan test patterns is stored for each corresponding scan test pattern.

In step 108, the set of stuck-at fault scan test patterns generated in step 106 is re-ordered according to the number of stuck-at faults that each test pattern can detect. For example, if pattern "A" can detect 20 faults, pattern "B" can detect 8 faults, pattern "C" can detect 25 faults, and pattern "D" can detect 12 faults, then the test patterns are re-ordered as "C" (25), "A" (20), "D" (12), "B" (8). The re-ordering of the stuck-at fault test patterns is an important feature of the present invention.

In step 110, the stuck-at fault coverage is plotted as a function of the test pattern number in the re-ordered set of stuck-at fault test patterns.

FIG. 2 illustrates a table of values 200 used to generate the plot of FIG. 3.

FIG. 3 illustrates a plot of stuck-at fault coverage 300 as a function of the stuck-at fault test pattern number according to an embodiment of the present invention. In the example of FIG. 3, approximately 90 percent fault coverage is achieved from the first 800 scan test patterns, while 3411 additional, or "top-off", test patterns are needed to achieve the maximum fault coverage of 97.45 percent. The advantageously high fault coverage achieved from a relatively low number of test patterns is a direct result of the re-ordering the test patterns described above.

In step 112, a list of faults that may be captured for each scan clock domain in the integrated circuit design is generated. Scan set and reset signals that are declared as scan clocks are preferably constrained to their inactive values, since they do not capture transition faults into scan cells. Another list of faults is generated that contains faults that may not be captured by any of the scan clocks.

In step 114, a set of transition delay fault scan patterns is generated for each scan clock domain by, for example, commercially available scan test generation software. The generated scan test patterns should be able to run at functional speed for the launch and capture cycles of a fault simulation run.

In step 116, if fewer than a selected number of test patterns, for example, 200, are generated for a corresponding scan clock domain, no truncation is performed. If more than the selected number of test patterns is generated for the corresponding scan clock domain, then the total number of faults that may be detected by each of the test patterns generated for the corresponding scan clock domain is calculated. The set of transition delay fault test patterns for each corresponding scan clock domain is re-ordered according to the number of faults that may be detected by each test pattern as described above. The re-ordering of the transition delay fault test patterns according to the number of faults that each test pattern can detect is an important feature of the present invention. Each set of transition delay fault test patterns is truncated to remove the test patterns that can detect, for example, less than 10 percent of the total number of faults calculated for the corresponding scan clock domain. The test patterns in each set of transition delay fault test patterns that can detect, for example, at least 90 percent of the total number of faults calculated for each corresponding scan clock domain are retained. In the fault simulation, all scan clocks are preferably enabled, however only the scan clock for the corresponding clock domain is enabled during launching and capturing the scan test patterns, and only the faults associated with the scan clock for the corresponding clock domain are loaded. As a result, each fault simulation detects transition delay faults within the corresponding clock domain. For example, a fault that is launched by scan clock "A" is captured by scan clock "A". A list of the detected and undetected faults in each fault simulation is saved for each corresponding scan clock domain.

Empirical results show that using the truncated transition delay fault scan patterns that can detect at least 90 percent of the faults in each scan clock domain screens out 99.9 percent of transition delay fault defect parts, while the total number of transition delay fault scan patterns is reduced by about 75 percent. While further truncation of the transition delay fault scan patterns may be required to fit into the scan memory of the test equipment, the previous truncation of the transition delay fault scan patterns according to fault coverage ensures that the number of defective parts that may not be detected is kept to a minimum.

In step 118, transition delay fault scan patterns are generated for the remaining undetected faults and cross-clock domain faults.

In step 120, if fewer than a selected number, for example, 200, test patterns are generated, no truncation is performed. If more than the selected number of test patterns is generated, then the total number of faults that may be detected by all test patterns in the set is calculated. The set of transition delay fault test patterns for the remaining undetected faults and cross-clock domain faults is re-ordered according to the number of faults that may be detected by each test pattern as described above. The set of transition delay fault test patterns is truncated to remove the test patterns that can detect, for example, less than 10 percent of the calculated total number of faults that may be detected by the full set of test patterns. The test patterns in the set of transition delay fault test patterns that can detect, for example, at least 90 percent of the total number of faults that may be detected by the full set of test patterns are retained.

In the fault simulation, all scan clocks are enabled during shifting, launching and capturing the scan test patterns. The list of faults that may not be captured by any of the scan clocks that was generated in step 110 and the fault list saved in step 112 are loaded to detect transition delay faults across clock domains. For example, a fault that is launched by scan clock "A" may be captured by scan clock "B". The generated transition delay fault test patterns should be simulated at the slowest scan clock speed for the launch and capture cycles.

In step 122, the total number of transition delay fault test patterns generated in steps 114 and 118 is calculated and saved for future reference.

In step 124, the sets of transition delay fault test patterns generated in steps 114 and 118 are evaluated to determine the stuck-at fault coverage using, for example, commercially available test software and test equipment.

In step 126, the sets of transition delay fault test patterns generated in steps 114 and 118 are ordered according to stuck-at fault coverage from the highest fault coverage to the least fault coverage to generate an ordered set. The ordering of the test pattern sets according to fault coverage results in improved stuck-at fault coverage and is an important feature of the present invention.

In step 128, a plot of stuck-at fault coverage is generated as a function of the number of transition delay fault test patterns of the ordered set generated in step 126.

FIGS. 4A and 4B illustrate a table of values 400 used to generate the plot of FIG. 5. The highlighted values of 2370 and 3714 represent the total number of transition delay fault patterns selected for all individual clock domain test runs and the total number of transition delay fault patterns selected for all individual clock domain test runs plus all clock domain test runs, respectively.

FIG. 5 illustrates a plot of stuck-at fault coverage 500 as a function of the test pattern number for the transition delay fault test patterns according to an embodiment of the present invention. The importance of arranging the transition delay fault test patterns in order of fault coverage may be appreciated from the slope of the resulting curve in FIG. 5. The steps in the curve occur at the beginning of each different set of transition delay fault test patterns.

In step 130, the number of top-off stuck-at fault test patterns is estimated from an analysis of the plots generated from the tables in FIG. 2 and FIGS. 4A and 4B. In this example, it is assumed that the scan memory can accommodate a total of 7,000 test patterns.

A first estimate may be made as follows. From FIG. 4B, if the transition delay fault test patterns are truncated to 3650 test patterns, then the corresponding stuck-at coverage is 91.29 percent, and there is scan memory available for 3350 top-off test patterns. From FIG. 2, the closest lower test coverage to the estimated number of test patterns is 91.03 percent, and 3315 top-off stuck-at fault test patterns are required to achieve a maximum 97.45 percent test coverage for a total of 4211 test patterns. However, there is still scan memory available for (3350−3315=35) more test patterns before reaching the 7,000 test pattern limit. If insufficient scan memory is available, then a lower number of transition delay fault test patterns is selected.

A second estimate may be made as follows. Because more scan memory is available, the number of transition delay fault test patterns may be truncated to 3682 in FIG. 4B. The corresponding stuck-at coverage is 91.33 percent, and there is scan memory available for 3318 top-off test patterns. From FIG. 2, from 91.30 percent, 3283 top-off stuck-at fault test patterns are required to achieve a maximum 97.45 percent test coverage for a total of 4211 test patterns. However, there is still scan memory available for (3318−3283=35) more test patterns before reaching the 7,000 test pattern limit.

A third estimate may be made as follows. From FIG. 4B, if the transition delay fault test patterns are truncated to 3714 test patterns, then the corresponding stuck-at coverage is 91.35 percent, and there is scan memory available for 3286 top-off test patterns. From FIG. 2, from 91.30 percent, 3283 top-off stuck-at fault test patterns are required to achieve a maximum 97.45 percent test coverage for a total of 4211 test patterns. However, there is still scan memory available for (3286−3283=3) more test patterns before reaching the 7,000 test pattern limit.

A fourth estimate may be made as follows. From FIG. 4, if the transition delay fault test patterns are truncated to 3746 test patterns, then the corresponding stuck-at coverage is 91.38 percent, and there is scan memory available for 3254 top-off test patterns. From FIG. 2, the closest lower test coverage to the estimated number of test patterns is 91.03 percent, and 3283 top-off stuck-at fault test patterns are required to achieve 97.45 percent test coverage for a total of 4211 test patterns. However, the available scan memory is (3254−3283=−29), therefore the scan memory lacks sufficient space for 29 top-off stuck-at fault test patterns.

A fifth estimate may be made as follows. From FIG. 4B, if the transition delay fault test patterns are truncated to 3778 test patterns, then the corresponding stuck-at coverage is 91.42 percent, and there is scan memory available for 3222 top-off test patterns. From FIG. 2, from 91.30 percent, 3283 top-off stuck-at fault test patterns are required to achieve 97.45 percent test coverage for a total of 4211 test patterns. However, the available scan memory is (3222−3283=−61), therefore the scan memory lacks sufficient space for 61 top-off stuck-at fault test patterns.

The above analysis determines that the values for third estimate utilizes most of the scan memory and is therefore the optimum estimate.

In step 132, if the total number of transition delay fault test patterns calculated in step 122 plus the number of top-off stuck-at fault test patterns estimated in step 128 is less than or equal to the maximum number of allowed test patterns calculated in step 104, then all the transition delay fault test patterns and the stuck-at fault test patterns should fit into the scan memory of the current scan test equipment, and step 132 is followed by step 140. Otherwise, step 132 is followed by step 134.

In step 134, the optimum number of transition delay fault test patterns is further truncated to make available sufficient scan memory to generate the top-off stuck-at fault test pattern to achieve the highest possible stuck-at fault coverage using the analysis described in step 128.

In step 136, the last set of transition delay fault test patterns is truncated so that only the selected test patterns remain to select as many transition delay fault test patterns as possible while still reserving sufficient scan memory for top-off stuck-at faults to achieve maximum stuck-at fault test coverage. For example, if there are 11 sets of transition delay fault test patterns, and 1344 out of 5920 test patterns are selected in the last set of test patterns, then only the first 1344 test patterns of the last test pattern set are saved. In some cases, there may be enough scan memory available so that fewer test patterns have to be removed from the last test pattern set.

In step 138, the truncated transition delay fault test patterns are fault graded for stuck-at fault coverage according to well known techniques. Both detected and undetected faults are saved.

In step 140, the top-off stuck-at fault test patterns are generated to achieve maximum fault coverage, loading only the undetected faults saved in step 136.

In step 142, if the total of the number of top-off stuck-at fault test patterns generated in step 140 plus the number of selected test patterns (either all the transition delay fault patterns or the truncated number of transition delay fault patterns generated in step 136) does not exceed the maximum number of test patterns allowed, then all the transition delay fault test patterns and stuck-at fault patterns can fit into the scan memory, and step 142 is followed by step 144. Otherwise, the transition delay fault test patterns must be further truncated by looping back to step 134.

In step 144, the selected transition delay fault test patterns and the top-off stuck-at fault patterns generated for stuck-at fault coverage are fault graded for stuck-at coverage according to well known techniques. The result is the final stuck-at fault coverage for the integrated circuit design.

In step 146, the transition delay fault test patterns selected for transition delay fault coverage are fault graded for transition delay fault coverage. The result is the final transition delay fault coverage for the integrated circuit design.

In step 148, a parallel fault simulation is performed for best and worst case conditions for all the selected transition delay fault and stuck-at fault test patterns. If a pattern mismatch occurs, the corresponding test pattern is debugged.

In step 150, a serial fault simulation is performed for best and worst case conditions for some, preferably at least five, of the transition delay fault and stuck-at fault test patterns. If a pattern mismatch occurs, the corresponding test pattern is debugged.

In step 152, other tests and checks may be performed for all the selected transition delay fault and stuck-at fault test patterns, for example, tester rules, bidirectional conflicts checking, and test program generation. If violations are detected, the test patterns may be debugged according to well known techniques.

In step 154, the final truncated transition delay fault scan test patterns and the corresponding number of top-off stuck-at fault scan test patterns that can fit into the scan memory is generated as output.

Step 156 is the exit point of the flow chart 100.

In another aspect of the present invention, a computer program product for generating a truncated scan test pattern for an integrated circuit design includes:

a medium for embodying a computer program for input to a computer; and a computer program embodied in the medium for causing the computer to perform steps of:
(a) receiving as input an integrated circuit design;
(b) estimating a number of transition delay fault test patterns and a corresponding number of top-off stuck-at fault patterns to achieve maximum stuck-at fault and transition delay fault coverage;
(c) truncating the estimated number of transition delay fault patterns to generate a truncated set of transition delay fault patterns so that the truncated set of transition delay fault patterns and the corresponding number of top-off stuck-at fault patterns achieve maximum stuck-at fault and transition delay fault coverage within a selected scan memory limit; and
(d) generating as output the truncated set of transition delay fault patterns and the corresponding number of top-off stuck-at fault patterns.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method of generating a truncated scan test pattern for an integrated circuit design comprising steps of:
   (a) receiving as input an integrated circuit design;
   (b) estimating a number of transition delay fault test patterns and a corresponding number of top-off stuck-at fault patterns to achieve maximum stuck-at fault and transition delay fault coverage;
   (c) truncating the estimated number of transition delay fault patterns to generate a truncated set of transition delay fault patterns so that the truncated set of transition delay fault patterns and the corresponding number of top-off stuck-at fault patterns achieve maximum stuck-at fault and transition delay fault coverage within a selected scan memory limit; and
   (d) generating as output the truncated set of transition delay fault patterns and the corresponding number of top-off stuck-at fault patterns.

2. The method of claim 1 wherein step (b) comprises generating a set of stuck-at fault test patterns.

3. The method of claim 2 wherein step (b) comprises ordering the set of stuck-at fault patterns according to fault coverage to generate a set of ordered stuck-at fault patterns.

4. The method of claim 3 wherein step (b) comprises generating a plot of fault coverage as a function of a number of stuck-at fault patterns from the ordered set of stuck-at fault patterns.

5. The method of claim 4 wherein step (b) comprises generating a set of transition delay fault patterns for each scan clock domain in the integrated circuit design.

6. The method of claim 5 wherein step (b) comprises ordering the transition delay fault patterns in the set of transition delay fault patterns for each scan clock domain according to stuck-at fault coverage to generate an ordered set of transition delay fault patterns for each scan clock domain.

7. The method of claim 6 wherein step (b) comprises ordering each ordered set of transition delay fault patterns according to a number of transition delay fault patterns therein to generate the estimated number of transition delay fault patterns.

8. The method of claim 7 wherein step (b) comprises generating a plot of transition delay fault coverage as a function of a number of transition delay fault patterns from the total set of transition delay fault patterns.

9. A computer program product for generating a truncated scan test pattern for an integrated circuit design comprising:
 a medium for embodying a computer program for input to a computer; and
 a computer program embodied in the medium for causing the computer to perform steps of:
 (a) receiving as input an integrated circuit design;
 (b) estimating a number of transition delay fault test patterns and a corresponding number of top-off stuck-at fault patterns to achieve maximum stuck-at fault and transition delay fault coverage;
 (c) truncating the estimated number of transition delay fault patterns to generate a truncated set of transition delay fault patterns so that the truncated set of transition delay fault patterns and the corresponding number of top-off stuck-at fault patterns achieve maximum stuck-at fault and transition delay fault coverage within a selected scan memory limit; and
 (d) generating as output the truncated set of transition delay fault patterns and the corresponding number of top-off stuck-at fault patterns.

10. The computer program product of claim 9 wherein step (b) comprises generating a set of stuck-at fault test patterns.

11. The computer program product of claim 10 wherein step (b) comprises ordering the set of stuck-at fault patterns according to fault coverage to generate a set of ordered stuck-at fault patterns.

12. The computer program product of claim 11 wherein step (b) comprises generating a plot of fault coverage as a function of a number of stuck-at fault patterns from the ordered set of stuck-at fault patterns.

13. The computer program product of claim 12 wherein step (b) comprises generating a set of transition delay fault patterns for each scan clock domain in the integrated circuit design.

14. The computer program product of claim 13 wherein step (b) comprises ordering the transition delay fault patterns in the set of transition delay fault patterns for each scan clock domain according to stuck-at fault coverage to generate an ordered set of transition delay fault patterns for each scan clock domain.

15. The computer program product of claim 14 wherein step (b) comprises ordering each ordered set of transition delay fault patterns according to a number of transition delay fault patterns therein to generate the estimated number of transition delay fault patterns.

16. The computer program product of claim 15 wherein step (b) comprises generating a plot of transition delay fault coverage as a function of a number of transition delay fault patterns from the total set of transition delay fault patterns.

* * * * *